(12) United States Patent
Uejima et al.

(10) Patent No.: US 12,261,351 B2
(45) Date of Patent: Mar. 25, 2025

(54) RADIO FREQUENCY MODULE AND COMMUNICATION DEVICE

(71) Applicant: Murata Manufacturing Co., Ltd., Kyoto (JP)

(72) Inventors: Takanori Uejima, Kyoto (JP); Shogo Yanase, Kyoto (JP); Yuto Aoki, Kyoto (JP); Yukiya Yamaguchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 109 days.

(21) Appl. No.: 18/311,377

(22) Filed: May 3, 2023

(65) Prior Publication Data

US 2023/0275338 A1 Aug. 31, 2023

Related U.S. Application Data

(63) Continuation of application No. PCT/JP2021/037690, filed on Oct. 12, 2021.

(30) Foreign Application Priority Data

Dec. 7, 2020 (JP) .................. 2020-202632

(51) Int. Cl.
*H01Q 1/22* (2006.01)
*H01Q 1/52* (2006.01)
*H01Q 9/04* (2006.01)

(52) U.S. Cl.
CPC .......... *H01Q 1/2283* (2013.01); *H01Q 1/526* (2013.01); *H01Q 9/0414* (2013.01)

(58) Field of Classification Search
CPC .... H01Q 1/2283; H01Q 1/526; H01Q 9/0414; H01L 23/00; H01L 25/04; H01L 25/18; H03H 9/25; H04B 1/38
See application file for complete search history.

(56) References Cited

U.S. PATENT DOCUMENTS

2013/0050028 A1* 2/2013 Nogami .................. H01Q 1/38
343/700 MS
2014/0176387 A1* 6/2014 Coles ..................... H01Q 1/526
343/841

(Continued)

FOREIGN PATENT DOCUMENTS

JP 2001-102517 A 4/2001
JP 2020-053812 A 4/2020

(Continued)

OTHER PUBLICATIONS

International Search Report for PCT/JP2021/037690 dated Dec. 28, 2021.

*Primary Examiner* — Wilson Lee
(74) *Attorney, Agent, or Firm* — McDonald Hopkins LLC (57) ABSTRACT

The radio frequency module includes a module substrate, an electronic component disposed on a main surface, a resin member covering at least part of the main surface and at least part of a side surface of the electronic component, and a metal shield layer that is formed on a surface of the resin member and is set to a ground potential. The electronic component has a top surface in contact with the metal shield layer, a bottom surface facing the main surface, a circuit portion formed at a position closer to the bottom surface than to the top surface, and a metal layer formed between the metal shield layer and the circuit portion. The metal layer is a barrier metal.

18 Claims, 6 Drawing Sheets

(56) References Cited

U.S. PATENT DOCUMENTS

| | | | |
|---|---|---|---|
| 2014/0353827 A1* | 12/2014 | Liu | H01L 25/18 |
| | | | 257/774 |
| 2017/0063328 A1 | 3/2017 | Tochishita | |
| 2018/0219272 A1* | 8/2018 | Baheti | H01Q 9/0407 |
| 2019/0273312 A1 | 9/2019 | Otsubo | |
| 2019/0305432 A1* | 10/2019 | Kim | H01Q 1/38 |
| 2020/0099361 A1 | 3/2020 | Hatakeyama et al. | |
| 2020/0203291 A1 | 6/2020 | Uejima | |
| 2021/0210438 A1 | 7/2021 | Nomura et al. | |
| 2021/0217675 A1* | 7/2021 | Oya | H01L 23/13 |
| 2022/0408558 A1* | 12/2022 | Kozono | C23C 18/08 |

FOREIGN PATENT DOCUMENTS

| | | |
|---|---|---|
| JP | 2020-102693 A | 7/2020 |
| WO | 2014/013831 A1 | 1/2014 |
| WO | 2015/178227 A1 | 11/2015 |
| WO | 2018/101384 A1 | 6/2018 |
| WO | 2020/067299 A1 | 4/2020 |

* cited by examiner

RADIO FREQUENCY MODULE AND COMMUNICATION DEVICE

CROSS REFERENCE TO RELATED APPLICATION

This is a continuation of International Application No. PCT/JP2021/037690 filed on Oct. 12, 2021 which claims priority from Japanese Patent Application No. 2020-202632 filed on Dec. 7, 2020. The contents of these applications are incorporated herein by reference in their entireties.

BACKGROUND ART

Technical Field

The present disclosure relates to a radio frequency module and a communication device.

Patent Document 1 discloses a radio frequency module including a substrate, a chip coil and a surface acoustic wave filter (electronic component) mounted on the substrate, a resin layer covering the chip coil and the surface acoustic wave filter, and a metal film formed on a surface of the resin layer.

Patent Document 1: International Publication No. 2014/013831

BRIEF SUMMARY

In the radio frequency module disclosed in Patent Document 1, a top surface of the surface acoustic wave filter is in contact with the metal film.

Incidentally, in the radio frequency module disclosed in Patent Document 1, since the metal film and the electronic component (surface acoustic wave filter) are in contact with each other, a metal may diffuse from the metal film into a circuit portion (interdigital transducer (IDT) electrode) of the electronic component (surface acoustic wave filter). When the diffused metal is mixed into the circuit portion of the electronic component as an impurity, characteristics of the electronic component may be deteriorated.

The present disclosure provides a radio frequency module and a communication device in which characteristic deterioration of an electronic component due to metal diffusion is suppressed.

A radio frequency module according to an aspect of the present disclosure includes a module substrate, an electronic component disposed on a main surface of the module substrate, a resin member covering at least part of the main surface and at least part of a side surface of the electronic component, and a first metal layer that is formed on a surface of the resin member and is set to a ground potential. The electronic component includes a first surface in contact with the first metal layer, a second surface facing the main surface, a circuit portion formed at a position closer to the second surface than to the first surface, and a second metal layer formed between the first metal layer and the circuit portion. The second metal layer is a barrier metal.

Further, a radio frequency module according to an aspect of the present disclosure includes a module substrate, an electronic component disposed on a main surface of the module substrate, a resin member covering at least part of the main surface and at least part of a side surface of the electronic component, and a first metal layer that is formed on a surface of the resin member and is set to a ground potential. The electronic component includes a first surface in contact with the first metal layer, a second surface facing the main surface, a circuit portion formed at a position closer to the second surface than to the first surface, and a second metal layer formed between the first metal layer and the circuit portion. The first metal layer is made of copper or an alloy containing copper, or is a multilayer body containing copper, and the second metal layer is made of titanium, tantalum, cobalt, tungsten, or an alloy containing at least one of titanium, tantalum, cobalt, and tungsten.

According to the present disclosure, it is possible to provide a radio frequency module and a communication device in which characteristic deterioration of an electronic component due to metal diffusion is suppressed.

DETAILED DESCRIPTION

Hereinafter, an embodiment of the present disclosure will be described in detail. Note that, it should be noted that the embodiment described below shows a comprehensive or specific example. Each of numerical values, shapes, materials, constituent elements, the dispositions and the connection forms of the constituent elements, and the like described in the following embodiment is an example, and is not intended to limit the present disclosure. Among the constituent elements in the following working example, a constituent element not described in the independent claims is described as an optional constituent element. Further, sizes or size ratios of the constituent elements illustrated in the drawings are not necessarily precise. In the drawings, substantially the same configurations are denoted by the same reference signs, and a redundant description may be omitted or simplified.

Further, in the following description, a term indicating a relationship between elements, such as parallel and perpendicular, a term indicating a shape of an element such as a rectangular shape, and a numerical range represent not only a strict meaning but also a substantially equivalent range, for example, including a difference of approximately several percent.

Furthermore, in the following description, "A is disposed on a first main surface of a substrate" means not only that A is directly mounted on the first main surface but also that A is disposed in a space on a side of the first main surface, out of the space on the side of the first main surface and a space on a side of a second main surface separated by the substrate.

That is, A may be mounted on the first main surface via another circuit element, an electrode, or the like.

Further, in a circuit configuration of the present disclosure, "connected" includes not only a case of being directly connected by a connection terminal and/or a wiring conductor but also a case of being electrically connected via another circuit component. Furthermore, "connected between A and B" means being connected to both A and B between A and B.

In each of the following drawings, an x-axis and a y-axis are axes orthogonal to each other on a plane parallel to a main surface of a module substrate. Further, a z-axis is an axis perpendicular to the main surface of the module substrate, and its positive direction indicates an upward direction and its negative direction indicates a downward direction.

Furthermore, in the module configuration of the present disclosure, "plan view" means that an object is viewed from a positive side of the z-axis by orthographic projection onto an xy plane. "A component is disposed on a main surface of a substrate" includes not only a case that the component is disposed on the main surface in a state of being in contact with the main surface of the substrate, but also a case that the component is disposed above the main surface without necessarily being in contact with the main surface, and a case that part of the component is disposed to be embedded in the substrate from a side of the main surface.

Further, hereinafter, in A, B, and C mounted on a substrate, "C is disposed between A and B in a plan view of the substrate (or the main surface of the substrate)" means that at least one of a plurality of line segments connecting any point in A and any point in B passes through a region of C in a plan view of the substrate. Furthermore, a plan view of a substrate means that a substrate and a circuit element mounted on the substrate are viewed by orthographic projection onto a plane parallel to a main surface of the substrate.

Furthermore, in the following description, a "transmission path" means a transfer line constituted of a wiring through which a radio frequency transmission signal propagates, an electrode directly connected to the wiring, a terminal directly connected to the wiring or the electrode, or the like. Furthermore, a "reception path" means a transfer line constituted of a wiring through which a radio frequency reception signal propagates, an electrode directly connected to the wiring, a terminal directly connected to the wiring or the electrode, or the like.

Embodiment

[1. Circuit Configuration of Radio Frequency Module 1 and Communication Device 5]

Figure 1:
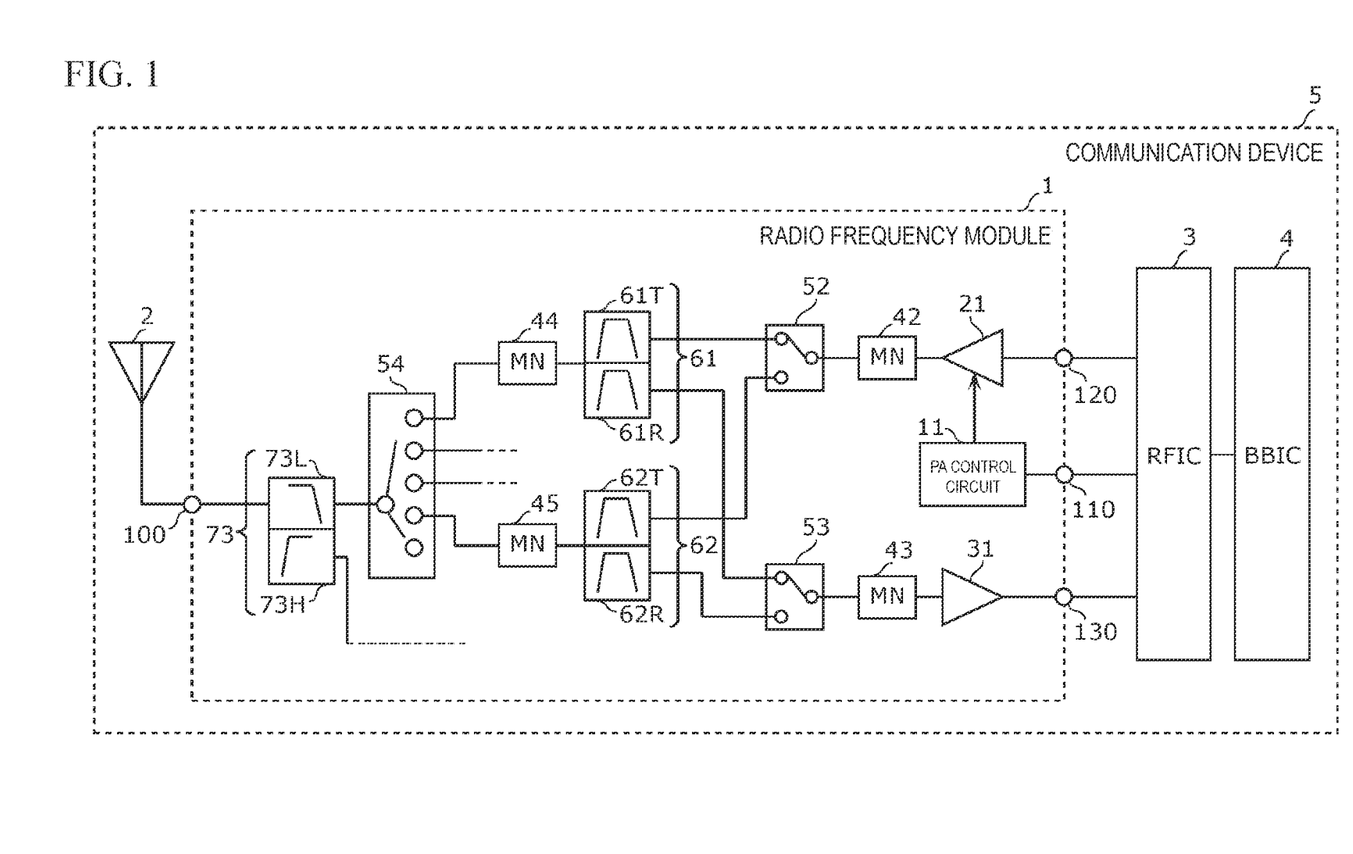
FIG. 1 is a circuit configuration diagram of a radio frequency module and a communication device according to an embodiment.

FIG. 1 is a circuit configuration diagram of a radio frequency module 1 and a communication device 5 according to an embodiment. As illustrated in FIG. 1, the communication device 5 includes the radio frequency module 1, an antenna 2, an RF signal processing circuit (RFIC) 3, and a baseband signal processing circuit (BBIC) 4.

The RFIC 3 is an RF signal processing circuit that processes a radio frequency signal transmitted and received by the antenna 2. Specifically, the RFIC 3 performs signal processing on a reception signal inputted via a reception path of the radio frequency module 1 by down-conversion or the like, and outputs the reception signal generated by the signal processing to the BBIC 4. Further, the RFIC 3 performs signal processing on a transmission signal inputted from the BBIC 4 by up-conversion or the like, and outputs the transmission signal generated by the signal processing to a transmission path of the radio frequency module 1.

The BBIC 4 is a circuit that performs signal processing using an intermediate frequency band lower than a radio frequency signal transferred through the radio frequency module 1. The signal processed in the BBIC 4 is used as an image signal for image display or as an audio signal for a call via a speaker, for example.

Further, the RFIC 3 also has a function as a control unit to control a connection in each of switches 52, 53, and 54 included in the radio frequency module 1 based on a communication band (frequency band) to be used. Specifically, the RFIC 3 changes over the connection in each of the switches 52 to 54 included in the radio frequency module 1 by a control signal (not illustrated). Specifically, the RFIC 3 outputs a digital control signal, to control the switches 52 to 54, to a PA control circuit 11. The PA control circuit 11 outputs a digital control signal to the switches 52 to 54 based on the digital control signal inputted from the RFIC 3, thereby controlling the connection and disconnection in each of the switches 52 to 54.

Further, the RFIC 3 also has a function as a control unit to control a gain of a power amplifier 21 included in the radio frequency module 1, and to control a power supply voltage Vcc and a bias voltage Vbias supplied to the power amplifier 21. Specifically, the RFIC 3 outputs a digital control signal to a control signal terminal 110 of the radio frequency module 1. The PA control circuit 11 outputs a control signal, the power supply voltage Vcc, or the bias voltage Vbias to the power amplifier 21 by a digital control signal inputted via the control signal terminal 110, thereby adjusting the gain of the power amplifier 21. Note that a control signal terminal to receive a digital control signal to control the gain of the power amplifier 21 from the RFIC 3 may be different from a control signal terminal to receive a digital control signal to control the power supply voltage Vcc and the bias voltage Vbias supplied to the power amplifier 21 from the RFIC 3. Note that the control unit may be provided outside the RFIC 3, and may be provided in the BBIC 4, for example.

The antenna 2 is connected to an antenna connection terminal 100 of the radio frequency module 1, radiates a radio frequency signal outputted from the radio frequency module 1, and receives a radio frequency signal from the outside to output the radio frequency signal to the radio frequency module 1.

Note that, in the communication device 5 according to the present embodiment, the antenna 2 and the BBIC 4 are optional components.

Next, a detailed configuration of the radio frequency module 1 will be described.

As illustrated in FIG. 1, the radio frequency module 1 includes the antenna connection terminal 100, the power amplifier 21, the PA control circuit 11, a low-noise amplifier 31, duplexers 61 and 62, matching circuits 42, 43, 44, and 45, the switches 52, 53, and 54, a diplexer 73, the control signal terminal 110, a transmission input terminal 120, and a reception output terminal 130.

The antenna connection terminal 100 is an example of an input/output terminal and is an antenna common terminal connected to the antenna 2.

The power amplifier 21 is an amplification circuit to amplify radio frequency signals in a first communication band and a second communication band inputted from the transmission input terminal 120. The power amplifier 21 is included in a second base member 20. At least part of the second base member 20 is configured of GaAs, for example.

The power amplifier 21 includes a heterojunction bipolar transistor (HBT), for example.

The low-noise amplifier 31 is an amplification circuit to amplify radio frequency signals in the first communication band and the second communication band with low noise, and outputs the amplified radio frequency signals to the reception output terminal 130.

The PA control circuit 11 is an example of a control circuit to adjust the gain of the power amplifier 21 by a digital control signal or the like inputted via the control signal terminal 110. The PA control circuit 11 is included in a first base member 10 and is formed of a complementary metal oxide semiconductor (CMOS), for example. Specifically, the PA control circuit 11 is formed by a silicon on insulator (SOI) process. This makes it possible to manufacture the PA control circuit 11 at low cost. Note that, at least part of the first base member 10 is made of Si, for example.

The duplexer 61 includes a transmission filter 61T and a reception filter 61R. The duplexer 62 includes a transmission filter 62T and a reception filter 62R.

The transmission filter 61T is connected to an output terminal of the power amplifier 21 via the switch 52 and the matching circuit 42, and allows a transmission signal in the first communication band to pass through. The transmission filter 61T is disposed on a transmission path connecting the transmission input terminal 120 and the antenna connection terminal 100. Further, the transmission filter 62T is connected to the output terminal of the power amplifier 21 via the switch 52 and the matching circuit 42, and allows a transmission signal in the second communication band to pass through. The transmission filter 62T is connected to a transmission path connecting the transmission input terminal 120 and the antenna connection terminal 100.

The reception filter 61R is connected to a reception path connecting the reception output terminal 130 and the antenna connection terminal 100, and allows a reception signal in the first communication band to pass through. Further, the reception filter 62R is connected to a reception path connecting the reception output terminal 130 and the antenna connection terminal 100, and allows a reception signal in the second communication band to pass through.

Note that each of the duplexers 61 and 62 may be a single filter to transfer in a time division duplex (TDD) system. In the case above, a switch to change over between transmission and reception is disposed in at least one of a preceding stage and a subsequent stage of the single filter.

The switch 52 has a common terminal and two selection terminals. The common terminal of the switch 52 is connected to the output terminal of the power amplifier 21 via the matching circuit 42. One selection terminal of the switch 52 is connected to the transmission filter 61T, and the other selection terminal of the switch 52 is connected to the transmission filter 62T. In the connection configuration above, the switch 52 changes over the two connections, in which one is a connection of the power amplifier 21 and the transmission filter 61T and the other is a connection of the power amplifier 21 and the transmission filter 62T. The switch 52 is configured by a single-pole double-throw (SPDT) type switch circuit, for example.

The switch 53 has a common terminal and two selection terminals. The common terminal of the switch 53 is connected to an input terminal of the low-noise amplifier 31 via the matching circuit 43. One selection terminal of the switch 53 is connected to the reception filter 61R, and the other selection terminal of the switch 53 is connected to the reception filter 62R. In the connection configuration above, the switch 53 changes over connection and disconnection of the low-noise amplifier 31 and the reception filter 61R, and changes over connection and disconnection of the low-noise amplifier 31 and the reception filter 62R. The switch 53 is configured by an SPDT type switch circuit, for example.

The switch 54, being an example of an antenna switch, is connected to the antenna connection terminal 100 via the diplexer 73. The switch 54 changes over (1) connection and disconnection of the antenna connection terminal 100 and the duplexer 61, and (2) connection and disconnection of the antenna connection terminal 100 and the duplexer 62.

The matching circuit 42 is connected between the power amplifier 21 and the transmission filters 61T and 62T, and performs impedance matching between the power amplifier 21 and the transmission filter 61T, and impedance matching between the power amplifier 21 and the transmission filter 62T.

The matching circuit 43 is connected between the low-noise amplifier 31 and the reception filters 61R and 62R, and performs impedance matching between the low-noise amplifier 31 and the reception filter 61R, and impedance matching between the low-noise amplifier 31 and the reception filter 62R.

The matching circuit 44 is disposed on a path connecting the switch 54 and the duplexer 61, and performs impedance matching between the duplexer 61, and the antenna 2 and the switch 54. The matching circuit 45 is disposed on a path connecting the switch 54 and the duplexer 62, and performs impedance matching between the duplexer 62, and the antenna 2 and the switch 54.

The diplexer 73 is an example of a multiplexer, and is constituted of filters 73L and 73H. The filter 73L is a filter whose pass band is a frequency range of a first frequency band group including the first communication band and the second communication band, and the filter 73H is a filter whose pass band is a frequency range of another frequency band group including frequencies different from those of the first frequency band group. One terminal of the filter 73L and one terminal of the filter 73H are commonly connected to the antenna connection terminal 100. Each of the filters 73L and 73H is an LC filter constituted of at least one of an inductor and a capacitor in a chip-shape, for example.

Note that, it is sufficient that the radio frequency module 1 according to the present embodiment includes at least one of the power amplifier 21, the transmission filter 61T, and the transmission filter 62T among the circuit components illustrated in FIG. 1.

Further, the low-noise amplifier 31 and the switches 52 to 54 may be formed in a single semiconductor integrated circuit (IC). The semiconductor IC is constituted of a CMOS, for example. Specifically, the semiconductor IC is formed with an SOI process. With this, the semiconductor IC may be manufactured at low cost. Note that the semiconductor IC may be made of at least any of GaAs, SiGe, and GaN. With this, it is possible to output a radio frequency signal having high quality amplification performance and noise performance.

Here, in a case that an electronic component is in contact with a metal film, there is a possibility that a metal diffuses from the metal film into a circuit portion of the electronic component. When the diffused metal is mixed into the circuit portion of the electronic component as an impurity, structure of the circuit portion may vary to deteriorate characteristics of the electronic component.

On the other hand, a configuration of the radio frequency module 1 to suppress metal diffusion to a circuit portion of an electronic component will be described below.

[2. Disposition Configuration of Circuit Elements of Radio Frequency Module 1A According to Working Example]

Figure 2A:
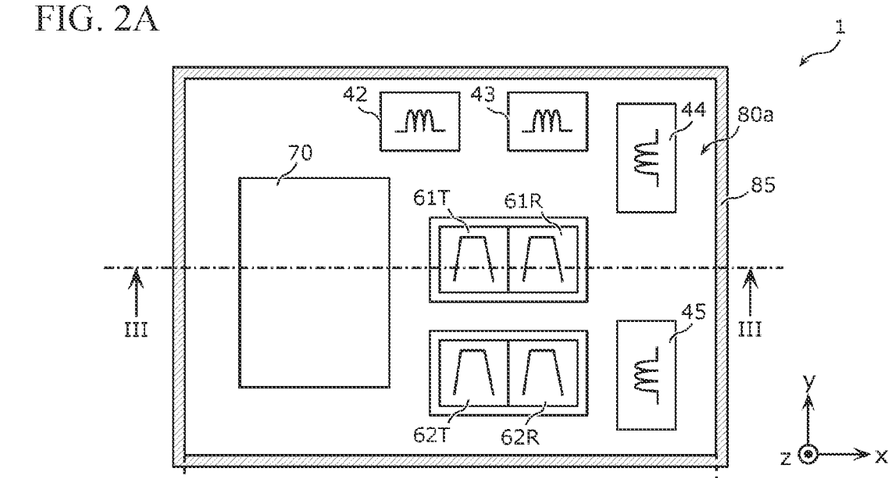
FIGS. 2A and 2B are schematic plan configuration diagrams of a radio frequency module according to a working example.
Figure 2B:
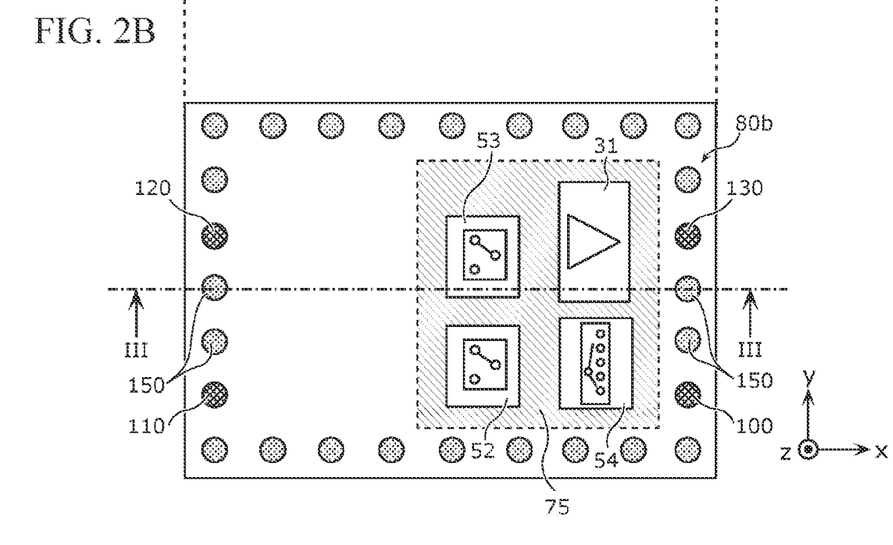
Figure 3:
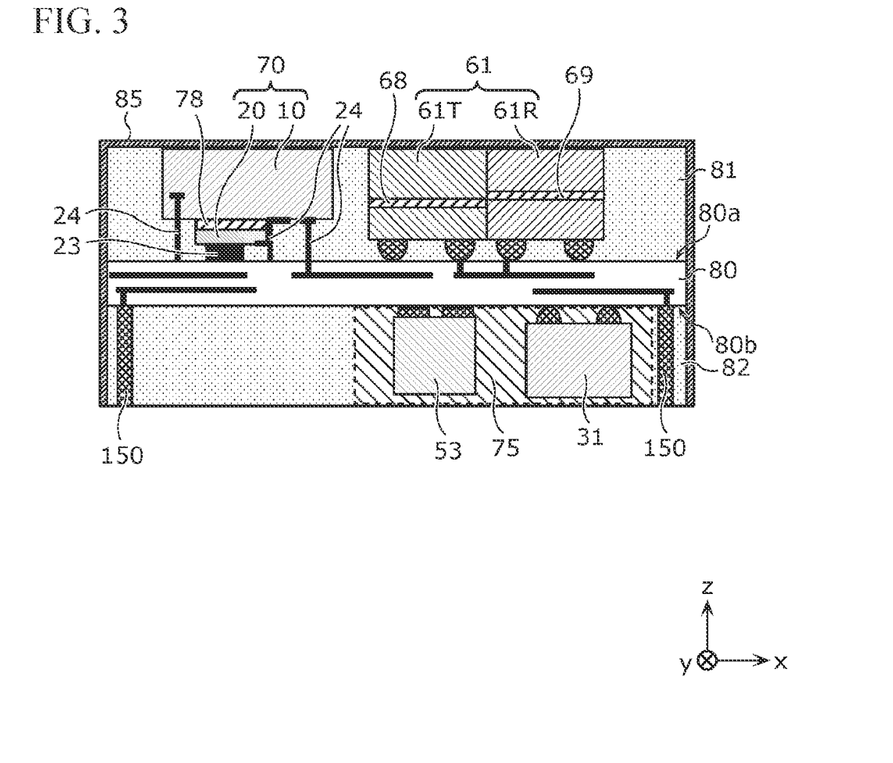
FIG. 3 is a schematic sectional configuration diagram of the radio frequency module according to the working example.

FIGS. 2A and 2B are schematic plan configuration diagrams of a radio frequency module 1A according to a working example. Further, FIG. 3 is a schematic sectional configuration diagram of the radio frequency module 1A according to the working example, and specifically, is a sectional view taken along a line III-III in FIGS. 2A and 2B. Note that, in FIG. 2A, illustrated is a disposition diagram of circuit components when a main surface 80a, out of the main surface 80a and a main surface 80b of a module substrate 80 opposite to each other, is viewed from a side of a z-axis positive direction. Meanwhile, in FIG. 2B, illustrated is a perspective view of a disposition of circuit components when the main surface 80b is viewed from the side of the z-axis positive direction. Further, in FIGS. 2A and 2B, each circuit component is provided with a mark representing a function thereof so that the positional relationship between the circuit components may easily be understood, but the mark is not provided in the actual radio frequency module 1A.

The radio frequency module 1A according to the working example specifically represents the disposition configuration of the circuit elements constituting the radio frequency module 1 according to the embodiment.

As illustrated in FIGS. 2A, 2B and FIG. 3, the radio frequency module 1A according to the present working example further includes the module substrate 80, resin members 81 and 82, an outer connection terminal 150, a metal shield layer 85, and a semiconductor IC 70 in addition to the circuit configuration illustrated in FIG. 1.

Further, the power amplifier 21 and the PA control circuit 11 illustrated in FIG. 1 are included in the semiconductor IC 70.

The module substrate 80 has the main surface 80a (first main surface) and the main surface 80b (second main surface) opposite to each other, and is a substrate on which the electronic components constituting the radio frequency module 1A are mounted. As the module substrate 80, there is used a low temperature co-fired ceramics (LTCC) substrate having a laminated structure of a plurality of dielectric layers, a high temperature co-fired ceramics (HTCC) substrate, a component built-in substrate, a substrate having a redistribution layer (RDL), a printed substrate, or the like, for example.

Note that, as illustrated in FIG. 2B, the antenna connection terminal 100, the control signal terminal 110, the transmission input terminal 120, and the reception output terminal 130 may be formed on the main surface 80b.

The resin member 81 is disposed on the main surface 80a, and covers part of the electronic components constituting the radio frequency module 1A and the main surface 80a. The resin member 82 is disposed on the main surface 80b, and covers part of the electronic components constituting the radio frequency module 1A and the main surface 80b. The resin members 81 and 82 each have a function to ensure reliability such as mechanical strength and moisture resistance of the electronic components constituting the radio frequency module 1A. Note that the resin member 82 is an optional constituent element of the radio frequency module 1 according to the present embodiment.

The metal shield layer 85 is an example of a first metal layer, is formed on a surface of the resin member 81, and is set to a ground potential. The metal shield layer 85 is a metal thin film formed by a sputtering method, for example, and is made of copper or an alloy containing copper, or is a multilayer body containing copper.

As illustrated in FIGS. 2A, 2B and FIG. 3, in the radio frequency module 1A according to the present working example, the semiconductor IC 70, the duplexers 61 and 62, and the matching circuits 42 to 45 are arranged on the main surface 80a. Meanwhile, the low-noise amplifier 31 and the switches 52 to 54 are arranged on the main surface 80b.

Note that, in the radio frequency module 1A according to the present working example, it is suitable that either one of the semiconductor IC 70 or the transmission filter 61T is disposed on the main surface 80a, and other circuit components may be arranged on either of the main surface 80a or the main surface 80b, or may be built in the module substrate 80.

Further, although not illustrated in FIGS. 2A, 2B and FIG. 3, the diplexer 73 may be surface-mounted on either of the main surface 80a and the main surface 80b, or may be built in the module substrate 80.

Furthermore, although not illustrated in FIGS. 2A and 2B, wirings connecting the electronic components in FIG. 1 are formed inside the module substrate 80 and on the main surfaces 80a and 80b. Furthermore, the wirings may be bonding wires whose both ends are each bonded to the main surface 80a or 80b, and any of the electronic components constituting the radio frequency module 1A. Furthermore, the wirings may be terminals, electrodes, or wirings formed on surfaces of the electronic components constituting the radio frequency module 1A.

Furthermore, in the radio frequency module 1A according to the present working example, a plurality of outer connection terminals 150 is disposed on the main surface 80b. The radio frequency module 1A exchanges electric signals with an outer substrate disposed on a side of a z-axis negative direction of the radio frequency module 1A through the plurality of outer connection terminals 150. Further, some of the plurality of outer connection terminals 150 are set to a ground potential of the outer substrate. Out of the main surfaces 80a and 80b, the main surface 80b facing the outer substrate is not provided with a duplexer, and an inductor and a capacitor (matching circuit) in a chip shape, which are hard to reduce in height, but is provided with the low-noise amplifier 31 and the switches 52 to 54, which are easy to reduce in height. This makes it possible to reduce the entire radio frequency module 1A in height.

Note that the outer connection terminal 150 may be a columnar electrode penetrating through the resin member 82 in the z-axis direction as illustrated in FIGS. 2A, 2B and FIG. 3, or the outer connection terminal 150 may be a bump electrode formed on the main surface 80b. In the case of the bump electrode, the resin member 82 on the main surface 80b may be omitted.

Further, in the radio frequency module 1A according to the present working example, the semiconductor IC 70 including the power amplifier 21 and the low-noise amplifier 31 are disposed on the main surfaces, different from each other, of the module substrate 80.

With this, since the module substrate 80 is disposed between the power amplifier 21 and the low-noise amplifier 31, isolation between transmission and reception is improved.

Further, the low-noise amplifier 31 and the switches 52 to 54 may be included in a semiconductor IC 75 on the main surface 80b. With this, the radio frequency module 1A may be reduced in size.

[2.1 Multilayer Configuration of Power Amplification Module (Semiconductor IC 70)]

The semiconductor IC 70 is an example of the electronic component, more specifically, a power amplification module. As illustrated in FIG. 3, a top surface (main surface 10b: first surface) of the semiconductor IC 70 is in contact with the metal shield layer 85.

The semiconductor IC 70 includes the first base member 10, the second base member 20, and a barrier metal layer 78.

At least part of the first base member 10 is made of a first semiconductor material. As an example of the first semiconductor material, an elemental semiconductor is cited, in particular silicon (Si) is cited. In the present working example, at least part of the first base member 10 is made of Si. Note that the first semiconductor material is not limited to silicon. For example, as the first semiconductor material, a material below or a multicomponent mixed crystal material made of a plurality of materials below may be used, but the first semiconductor material is not limited thereto. The material includes any of gallium arsenide, aluminum arsenide (AlAs), indium arsenide (InAs), indium phosphide (InP), gallium phosphide (GaP), indium antimonide (InSb), gallium nitride, indium nitride (InN), aluminum nitride (AlN), silicon, germanium (Ge), silicon carbide (SiC), and gallium oxide (III) ($Ga_2O_3$).

In the present working example, the PA control circuit 11 is formed in the first base member 10. Note that the PA control circuit 11 is not required to be formed in the first base member 10, and may be disposed on the main surface 80a or 80b of the module substrate 80.

At least part of the second base member 20 is made of a second semiconductor material different from the first semiconductor material, and the power amplifier 21 is formed in the second base member 20. As an example of the second semiconductor material, a compound semiconductor is cited, in particular gallium arsenide (GaAs) is cited. In the present working example, at least part of the second base member 20 is made of GaAs. Note that the second semiconductor material is not limited to gallium arsenide. For example, as the second semiconductor material, a material below or a multicomponent mixed crystal material made of a plurality of materials below may be used, but the second semiconductor material is not limited thereto. The material includes any of gallium arsenide, aluminum arsenide, indium arsenide, indium phosphide, gallium phosphide, indium antimonide, gallium nitride, indium nitride, aluminum nitride, silicon germanium, silicon carbide, gallium oxide (III), and gallium bismuth (GaBI).

As illustrated in FIG. 3, the second base member 20 is disposed between the module substrate 80 and the first base member 10, is bonded to the first base member 10 via the barrier metal layer 78, and is connected to the main surface 80a via an electrode 23.

The power amplifier 21 formed in the second base member 20 includes an amplification transistor, and the amplification transistor corresponds to a circuit portion formed at a position closer to a bottom surface than to a top surface of the semiconductor IC 70.

The barrier metal layer 78 is an example of a second metal layer, and is formed between the first base member 10 and the second base member 20 as illustrated in FIG. 3. The barrier metal layer 78 is made of titanium, tantalum, cobalt, tungsten, or an alloy containing at least one of titanium, tantalum, cobalt, and tungsten, for example.

In the radio frequency module LA, since the metal shield layer 85 and the semiconductor IC 70 are in contact with each other, a metal (Cu atoms, for example) may diffuse from the metal shield layer 85 into the power amplifier 21 formed in the second base member 20. When the diffused metal is mixed into the power amplifier 21 as an impurity, a structure of the power amplifier 21 may vary to deteriorate an amplification characteristic.

On the other hand, with the use of the configuration of the radio frequency module 1A described above, the barrier metal layer 78 is disposed between the metal shield layer 85 and the power amplifier 21. With this, a degree of metal diffusion from the barrier metal layer 78 into the power amplifier 21 may be made lower than a degree of metal diffusion from the metal shield layer 85 into the power amplifier 21. That is, in comparison with a semiconductor IC in which the barrier metal layer 78 is not disposed, the metal diffusion from the metal shield layer 85 into the power amplifier 21 may be suppressed. Thus, it is possible to suppress the deterioration of the amplification characteristic of the power amplifier 21 while strengthening a ground of the power amplifier 21.

Note that a degree of metal diffusion from A to B being low means as follows, for example. A weight in which a metal material constituting A diffuses into B is small, a velocity of diffusion in which the metal material constituting A diffuses into B is low, or the like. Specifically, it is defined that a diffusion coefficient in which the metal material constituting A diffuses into B is small.

In the present working example, the power amplifier 21 is formed in the second base member 20. Thus, a diffusion coefficient in which a metal material (any of Ti, Ta, Co, and W, for example) constituting the barrier metal layer 78 diffuses into the second base member 20 (second semiconductor material: GaAs, for example) is smaller than a diffusion coefficient in which a metal material (Cu, for example) constituting the metal shield layer 85 diffuses into the second base member 20 (second semiconductor material: GaAs, for example).

That is, the barrier metal layer 78 is defined as a metal layer having a property as follows. A diffusion coefficient in which the metal material constituting the barrier metal layer 78 diffuses into the circuit portion is smaller than a diffusion coefficient in which the metal material constituting the metal shield layer 85 diffuses into the circuit portion. The barrier metal layer 78 is made of titanium, tantalum, cobalt, tungsten, or an alloy containing at least one of titanium, tantalum, cobalt, and tungsten, for example.

Note that it is sufficient that the barrier metal layer 78 is formed between the metal shield layer 85 and the power amplifier 21. With this, it is possible to suppress the deterioration of the amplification characteristic of the power amplifier 21 while strengthening the ground of the power amplifier 21.

Hereinafter, the semiconductor IC 70 (power amplification module) will be described in detail. As described above, the semiconductor IC 70 includes the first base member 10, the second base member 20, and the barrier metal layer 78.

Figure 4:
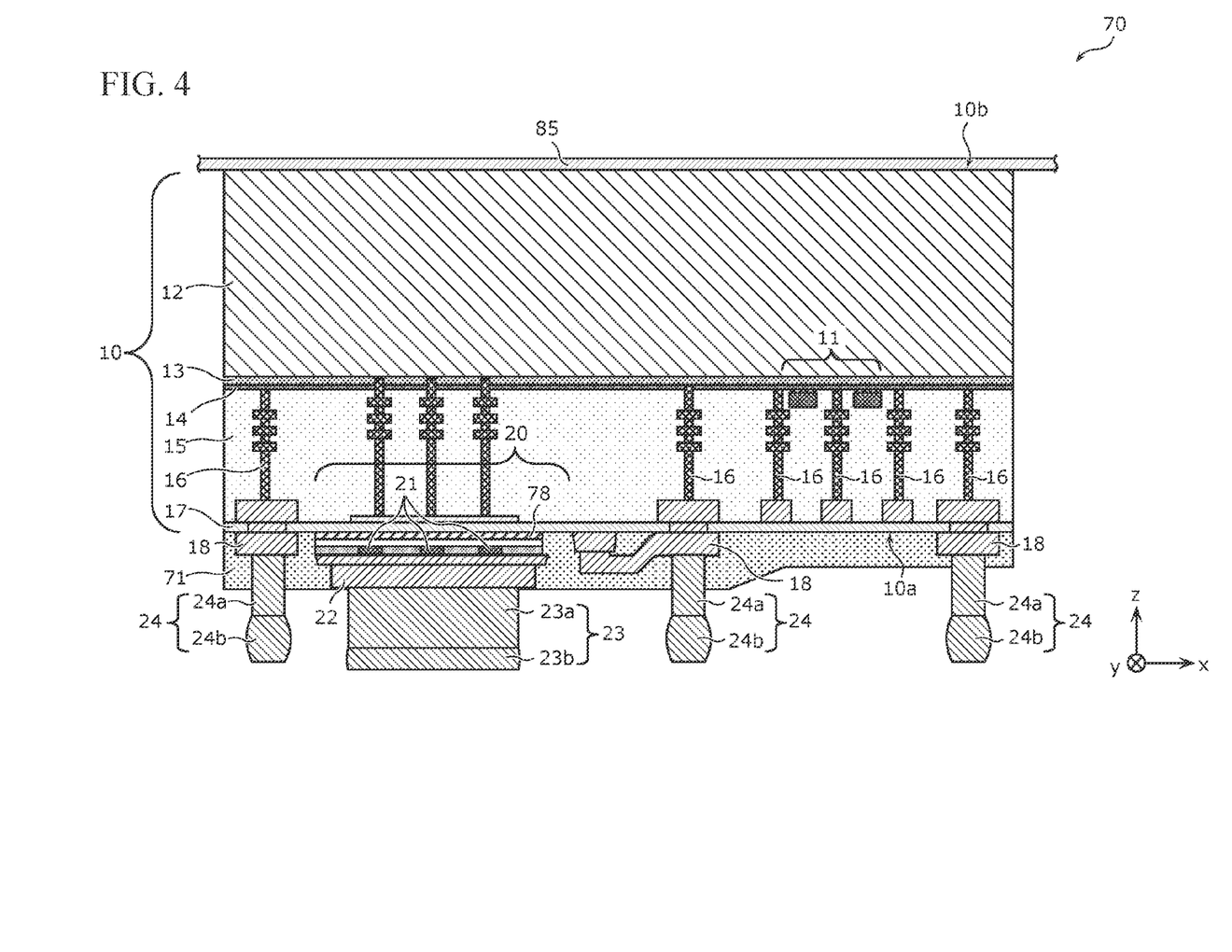
FIG. 4 is a sectional configuration diagram of a semiconductor IC according to the working example.
Figure 5:
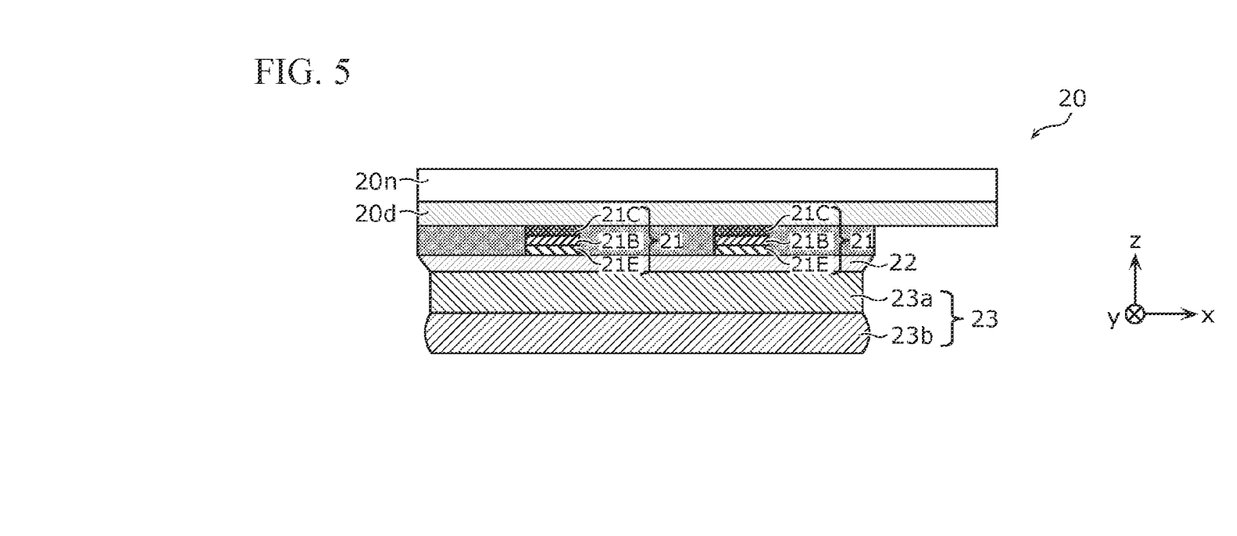
FIG. 5 is a sectional configuration diagram of a second base member according to the working example.

FIG. 4 is a sectional configuration diagram of the semiconductor IC 70 according to the working example. Further, FIG. 5 is a sectional configuration diagram of the second base member 20 according to the working example.

As illustrated in FIG. 4, the first base member 10 and the second base member 20 are laminated in the z-axis direction (direction perpendicular to main surface 80a).

The first base member 10 includes a Si substrate 12, an insulation layer 13, a Si layer 14, a wiring layer 15, and a SiN layer 17, for example. The SiN layer 17, the wiring layer 15, the Si layer 14, the insulation layer 13, and the Si substrate 12 are laminated in this order from a side of the main surface 80a.

The Si substrate 12 is made of a silicon single crystal, for example.

The Si layer 14 is a layer made of silicon, for example, and is a layer on which a circuit element constituting the PA control circuit 11 is formed.

The wiring layer 15 is a layer made of silicon oxide inside which a via wiring 16, to transfer a control signal from the PA control circuit 11 to the second base member 20 and the module substrate 80, is formed, for example.

The SiN layer 17 is a protective layer made of silicon nitride, for example, and is a layer to ensure reliability such as moisture resistance of the first base member 10.

The first base member 10 is connected to the main surface 80a via an electrode 24 (second electrode) extending from the first base member 10 to the main surface 80a. The electrode 24 includes a columnar conductor 24a and a bump electrode 24b, for example. One end of the columnar conductor 24a is bonded to an electrode 18 formed on the SiN layer 17, and the other end is bonded to the bump electrode 24b. The bump electrode 24b is connected to an electrode formed on the main surface 80a.

With this, since the electronic component formed on the first base member 10 may directly exchange a radio frequency signal and a digital signal with the module substrate 80, a transmission loss of the signal may be reduced.

Note that it is sufficient that the first base member 10 includes the Si substrate 12, and other layers are optional. Further, the switches 52 to 54 may be included in the first base member 10.

Furthermore, a resin member 71 is disposed on a main surface 10a of the first base member 10. Furthermore, the resin member 71 covers the second base member 20.

Furthermore, as described above, the first base member 10 includes the Si substrate 12, the Si layers 14 and 17. That is, the semiconductor IC 70 has silicon layers arranged between the circuit portion and the top surface (main surface 10a: first surface).

Since a degree of metal diffusion from the metal shield layer 85 into a silicon layer is high (diffusion coefficient is large), in a case that the barrier metal layer 78 is not formed, metal diffusion from the metal shield layer 85 into the second base member 20 through the first base member 10 is likely to occur. On the other hand, in the semiconductor IC 70 according to the present working example, since the barrier metal layer 78 is formed between the metal shield layer 85 and the circuit portion, even when a metal of the metal shield layer 85 diffuses into the first base member 10, the metal diffusion into the second base member 20 may be suppressed.

That is, the barrier metal layer 78 is defined as a metal layer having a property as follows. The diffusion coefficient in which the metal material constituting the barrier metal layer 78 diffuses into the circuit portion is smaller than the diffusion coefficient in which the metal material constituting the metal shield layer 85 diffuses into the circuit portion.

As illustrated in FIG. 5, the second base member 20 includes a GaAs base member layer 20n and an epitaxial layer 20d, for example.

The GaAs base member layer 20n is a single crystal substrate made of gallium arsenide, for example.

The epitaxial layer 20d is a layer in which GaAs epitaxially grows on the GaAs base member layer 20n, for example.

The power amplifier 21 is formed on the epitaxial layer 20d, for example.

The GaAs base member layer 20n is bonded to the SiN layer 17 of the first base member 10 via the barrier metal layer 78. That is, the second base member 20 is bonded to the first base member 10 via the barrier metal layer 78.

The power amplifier 21 includes an amplification transistor, and the amplification transistor has a collector layer 21C, a base layer 21B, and an emitter layer 21E. The collector layer 21C, the base layer 21B, and the emitter layer 21E are laminated in this order on the epitaxial layer 20d. That is, in the amplification transistor, the collector layer 21C, the base layer 21B, and the emitter layer 21E are laminated in this order from a side of the first base member 10.

Further, the second base member 20 is connected to the main surface 80a via the electrode 23 (first electrode) extending from the second base member 20 to the main surface 80a. The electrode 23 is constituted of a columnar conductor 23a and a bump electrode 23b, for example. One end of the columnar conductor 23a is bonded to an electrode 22 formed on a main surface of the second base member 20, and the other end is bonded to the bump electrode 23b. The bump electrode 23b is connected to an electrode formed on the main surface 80a.

With this, since the power amplifier 21 of the second base member 20 may directly exchange signals with the module substrate 80, a transmission loss of a signal may be reduced.

Further, the power amplifier 21 of the second base member 20 may receive a digital control signal, a DC signal, and the like from the PA control circuit 11 of the first base member 10 through the via wiring 16.

As illustrated in FIG. 4 and FIG. 5, the top surface of the semiconductor IC 70 (main surface 10b: first surface) is in contact with the metal shield layer 85, and the bottom surface of the semiconductor IC 70 (front surface of the resin member 71: second surface) faces the main surface 80a.

Note that the top surface of the semiconductor IC 70 is a main surface farther from the main surface 80a (side of the z-axis positive direction) out of surfaces of the semiconductor IC 70 opposite to each other, and the bottom surface of the semiconductor IC 70 is a main surface closer to the main surface 80a (side of the z-axis negative direction) out of the surfaces of the semiconductor IC 70 opposite to each other.

Further, thermal conductivity of the first semiconductor material constituting the first base member 10 may be higher than thermal conductivity of the second semiconductor material constituting the second base member 20.

With this, a heat dissipation property from the second base member 20 to the first base member 10 is improved.

Further, as illustrated in FIG. 4, the second base member 20 may be thinner than the first base member 10. In other words, a thickness of the second base member 20 in a thickness direction (z-axis direction) may be smaller than a thickness of the first base member 10 in the thickness direction (z-axis direction).

With this, since the second base member 20 having low thermal conductivity is relatively thin and the first base member 10 having high thermal conductivity is relatively thick, heat conduction from the second base member 20 to the first base member 10 is accelerated, and thus, the heat dissipation property is improved.

[2.2 Multilayer Configuration of Transmission Filter 61T]

Figure 6:
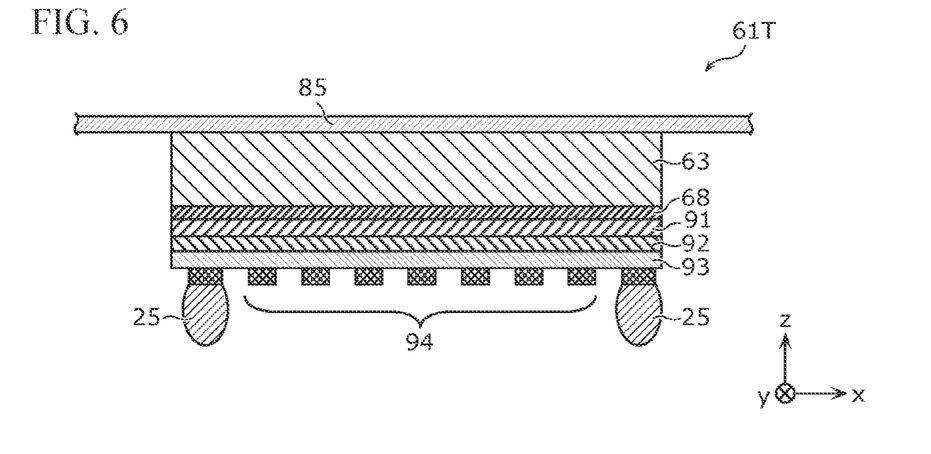
FIG. 6 is a sectional configuration diagram of a first example of a transmission filter according to the working example.

FIG. 6 is a sectional configuration diagram illustrating a first example of the transmission filter 61T according to the working example.

The transmission filter 61T is an example of the electronic component, and more specifically, a surface acoustic wave filter. As illustrated in FIG. 6, a top surface (support substrate 63: first surface) of the transmission filter 61T is in contact with the metal shield layer 85. Further, a bottom surface (piezoelectric layer 93: second surface) of the transmission filter 61T faces the main surface 80a, and is connected to the main surface 80*a* via a bump electrode 25 formed on the piezoelectric layer 93.

Note that the top surface of the transmission filter 61T is a main surface farther from the main surface 80*a* (side of the z-axis positive direction) out of surfaces of the transmission filter 61T opposite to each other, and the bottom surface of the transmission filter 61T is a main surface closer to the main surface 80*a* (side of the z-axis negative direction) out of the surfaces of the transmission filter 61T opposite to each other.

The transmission filter 61T includes the piezoelectric layer 93, the support substrate 63, a barrier metal layer 68, a high acoustic velocity layer 91, a low acoustic velocity layer 92, and an IDT electrode 94. The support substrate 63, the barrier metal layer 68, the high acoustic velocity layer 91, the low acoustic velocity layer 92, the piezoelectric layer 93, and the IDT electrode 94 are laminated in this order.

The piezoelectric layer 93 is made of $LiTaO_3$ piezoelectric single crystal or piezoelectric ceramics, for example.

The support substrate 63 is a substrate to support the high acoustic velocity layer 91, the low acoustic velocity layer 92, the piezoelectric layer 93, and the IDT electrode 94, and is made of silicon, for example.

The high acoustic velocity layer 91 is a layer in which an acoustic velocity of a bulk wave propagating through the high acoustic velocity layer 91 is higher than that of an acoustic wave such as a surface wave and a boundary wave propagating through a piezoelectric layer. The high acoustic velocity layer 91 functions to confine a surface acoustic wave in a portion where the piezoelectric layer 93 and the low acoustic velocity layer 92 are laminated, and to prevent the surface acoustic wave from leaking downward from the high acoustic velocity layer 91.

The low acoustic velocity layer 92 is a layer in which an acoustic velocity of a bulk wave propagating through the low acoustic velocity layer 92 is lower than an acoustic velocity of a bulk wave propagating through the piezoelectric layer 93, and the low acoustic velocity layer 92 is disposed between the piezoelectric layer 93 and the high acoustic velocity layer 91. Because of the structure and nature that energy of an acoustic wave inherently concentrates in a medium having a low acoustic velocity, leakage of a surface acoustic wave energy to the outside of the IDT electrode 94 is suppressed.

Note that the support substrate 63 and the high acoustic velocity layer 91 may be made of the same material, and in this case, the support substrate 63 and the high acoustic velocity layer 91 may be a high acoustic velocity support substrate.

In the configuration described above, when a radio frequency signal is inputted between a pair of comb-shaped electrodes constituting the IDT electrode 94, an electric potential difference occurs between the comb-shaped electrodes in the pair, and thus, the piezoelectric layer 93 is distorted to generate a surface acoustic wave. Here, by making a wavelength of the IDT electrode 94 (twice the inter electrode finger spacing) substantially equal to a wavelength of a pass band of the transmission filter 61T, only a radio frequency signal having a frequency component, desired to make pass through, passes through the transmission filter 61T.

Note that, with the use of a multilayer structure of the transmission filter 61T described above, it is possible to greatly increase a Q factor at a resonant frequency and an anti-resonant frequency in comparison with a structure in the past in which a piezoelectric substrate is used in a single layer. That is, since an acoustic wave resonator having a high Q factor may be formed, a filter having a low insertion loss may be configured using the acoustic wave resonator.

Note that the surface acoustic wave refers to propagation of an acoustic wave on a surface of the piezoelectric layer 93 or an interface between a plurality of materials, and refers to various types of acoustic waves configured by using the IDT electrode 94. The surface acoustic wave includes a surface wave, a Love wave, a leaky wave, a Rayleigh wave, a boundary wave, a leaky SAW, a pseudo SAW, and a plate wave, for example.

The IDT electrode 94, the piezoelectric layer 93, and the low acoustic velocity layer 92 each are formed on a side of the bottom surface, out of the top surface and the bottom surface of the transmission filter 61T, and correspond to a circuit portion allowing a surface acoustic wave to propagate.

The barrier metal layer 68 is an example of the second metal layer, and is formed between the support substrate 63 and the high acoustic velocity layer 91 as illustrated in FIG. 6. The barrier metal layer 68 is made of titanium, tantalum, cobalt, tungsten, or an alloy containing at least one of titanium, tantalum, cobalt, and tungsten, for example.

The barrier metal layer 68 is defined as a metal layer as follows. A diffusion coefficient in which a metal material constituting the barrier metal layer 68 diffuses into the circuit portion is smaller than the diffusion coefficient in which the metal material constituting the metal shield layer 85 diffuses into the circuit portion.

In the radio frequency module 1A, since the metal shield layer 85 and the transmission filter 61T are in contact with each other, a metal (Cu atoms, for example) may diffuse from the metal shield layer 85 into the circuit portion. In particular, a transmission filter allowing a high-power transmission signal to pass through is in a state that temperature rises and metal diffusion is accelerated. When the diffused metal is mixed into the circuit portion as an impurity, the structure of the transmission filter 61T may vary to deteriorate a bandpass characteristic.

On the other hand, with the use of the configuration of the radio frequency module 1A described above, the barrier metal layer 68 is disposed between the metal shield layer 85 and the circuit portion. With this, a degree of metal diffusion from the barrier metal layer 68 into the circuit portion may be made lower than a degree of metal diffusion from the metal shield layer 85 into the circuit portion. That is, in comparison with a transmission filter in which the barrier metal layer 68 is not disposed, the diffusion of a metal from the metal shield layer 85 into the circuit portion may be suppressed. Thus, it is possible to suppress deterioration of the bandpass characteristic of the transmission filter 61T while strengthening a ground of the transmission filter 61T.

Note that, it is sufficient that the barrier metal layer 68 is formed between the metal shield layer 85 and the circuit portion. With this, it is possible to suppress the deterioration of the bandpass characteristic of the transmission filter 61T while strengthening the ground of the transmission filter 61T.

The transmission filter 61T may be a bulk acoustic wave filter, in addition to a surface acoustic wave filter.

Figure 7:
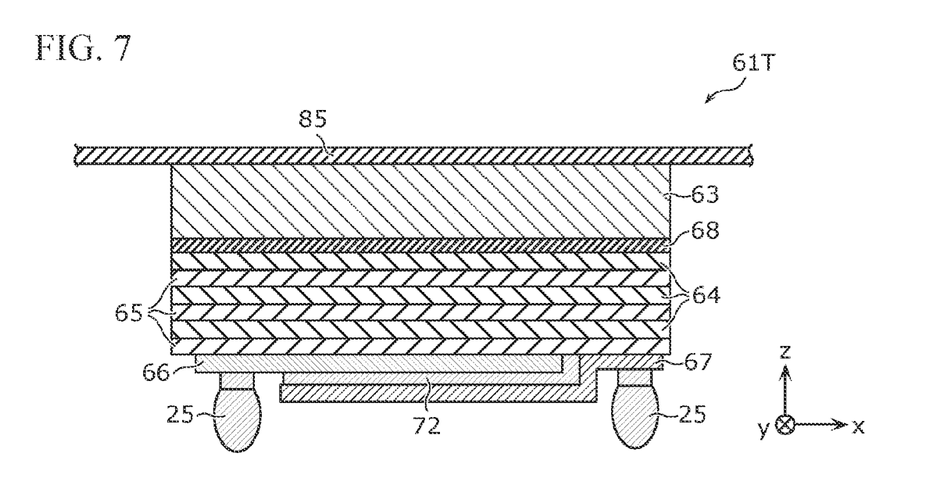
FIG. 7 is a sectional configuration diagram of a second example of the transmission filter according to the working example.

FIG. 7 is a sectional configuration diagram illustrating a second example of the transmission filter 61T according to the working example.

The transmission filter 61T is an example of the electronic component, and more specifically, is a solidly mounted resonator (SMR) type bulk acoustic wave filter. As illustrated in FIG. 7, the top surface (support substrate 63: first surface) of the transmission filter 61T is in contact with the metal shield layer 85. Further, the bottom surface (an upper electrode 66 and a lower electrode 67: second surface) of the transmission filter 61T faces the main surface 80a, and is connected to the main surface 80a via the bump electrode 25 formed on the surfaces of the upper electrode 66 and the lower electrode 67.

The transmission filter 61T according to the present example includes the support substrate 63, the barrier metal layer 68, a low acoustic impedance film 65, a high acoustic impedance film 64, the upper electrode 66 (third electrode), the lower electrode 67 (fourth electrode), and a piezoelectric layer 72. The low acoustic impedance film 65 and the high acoustic impedance film 64 are alternately laminated to form an acoustic multilayer film. In the transmission filter 61T, the support substrate 63, the barrier metal layer 68, the acoustic multilayer film, the upper electrode 66, the piezoelectric layer 72, and the lower electrode 67 are laminated in this order.

The support substrate 63 is a substrate to support the acoustic multilayer film, the upper electrode 66, the piezoelectric layer 72, and the lower electrode 67, and is made of silicon, for example.

With the structure described above, the SMR type bulk acoustic wave resonator confines a bulk acoustic wave below the acoustic multilayer film (upper electrode 66, piezoelectric layer 72, and lower electrode 67), using Bragg reflection by the acoustic multilayer film disposed between the support substrate 63 and the upper electrode 66.

In the configuration described above, when a radio frequency signal is inputted between the upper electrode 66 and the lower electrode 67, an electric potential difference is generated between the both electrodes, and thereby the piezoelectric layer 72 being distorted. This makes a bulk acoustic wave to be generated in a lamination direction of the upper electrode 66, the piezoelectric layer 72, and the lower electrode 67. Here, by making a film thickness of the piezoelectric layer 72 correspond to the wavelength of the pass band of the transmission filter 61T, only a radio frequency signal having a frequency component, desired to make pass through, passes through the transmission filter 61T.

The upper electrode 66, the piezoelectric layer 72, and the lower electrode 67 are formed on the side of the bottom surface out of the top surface and the bottom surface of the transmission filter 61T, and correspond to a circuit portion through which a bulk acoustic wave propagates.

The barrier metal layer 68 is an example of the second metal layer, and is formed between the support substrate 63 and the acoustic multilayer film as illustrated in FIG. 7. The barrier metal layer 68 is made of titanium, tantalum, cobalt, tungsten, or an alloy containing at least one of titanium, tantalum, cobalt, and tungsten, for example.

The barrier metal layer 68 is defined as a metal layer as follows. The diffusion coefficient in which the metal material constituting the barrier metal layer 68 diffuses into the circuit portion is smaller than the diffusion coefficient in which the metal material constituting the metal shield layer 85 diffuses into the circuit portion.

With the use of the configuration of the radio frequency module 1A of the present example described above, the barrier metal layer 68 is disposed between the metal shield layer 85 and the circuit portion. With this, the degree of metal diffusion from the barrier metal layer 68 into the circuit portion may be made lower than the degree of metal diffusion from the metal shield layer 85 into the circuit portion. That is, in comparison with a transmission filter in which the barrier metal layer 68 is not disposed, the diffusion of a metal from the metal shield layer 85 into the circuit portion may be suppressed. Thus, it is possible to suppress the deterioration of the bandpass characteristic of the transmission filter 61T while strengthening the ground of the transmission filter 61T.

Note that, it is sufficient that the barrier metal layer 68 is formed between the metal shield layer 85 and the circuit portion. With this, it is possible to suppress the deterioration of the bandpass characteristic of the transmission filter 61T while strengthening the ground of the transmission filter 61T.

Note that, as illustrated in FIG. 3, in addition to the transmission filter 61T, a barrier metal layer 69 may be formed in the reception filter 61R. With this, it is possible to suppress deterioration of a bandpass characteristic of the reception filter 61R while strengthening a ground of the reception filter 61R.

Note that, in the radio frequency module 1A according to the present working example, it is sufficient that at least one of the semiconductor IC 70 and the transmission filter 61T includes the barrier metal layer 68 or 78 described above.

3. Effects and the Like

As described above, the radio frequency module 1A according to the present working example includes the module substrate 80, the electronic component disposed on the main surface 80a, the resin member 81 covering at least part of the main surface 80a and at least part of the side surface of the electronic component, and the metal shield layer 85 that is formed on the surface of the resin member 81 and is set to the ground potential. The electronic component includes the top surface in contact with the metal shield layer 85, the bottom surface facing the main surface 80a, the circuit portion formed at a position closer to the bottom surface than to the top surface, and a metal layer formed between the metal shield layer 85 and the circuit portion, and the metal layer is a barrier metal.

With this, since the barrier metal is disposed between the metal shield layer 85 and the circuit portion, a degree of metal diffusion from the barrier metal to the circuit portion may be made lower than the degree of metal diffusion from the metal shield layer 85 into the circuit portion. That is, in comparison with a case that the barrier metal is not disposed, the diffusion of a metal from the metal shield layer 85 into the circuit portion may be suppressed. Thus, it is possible to suppress characteristic deterioration of an electronic component due to metal diffusion while strengthening a ground of the electronic component.

Further, the radio frequency module 1A according to the present working example includes the module substrate 80, an electronic component disposed on the main surface 80a, the resin member 81 covering at least part of the main surface 80a and at least part of the side surface of the electronic component, and the metal shield layer 85 that is formed on the surface of the resin member 81 and is set to the ground potential. The electronic component includes the top surface in contact with the metal shield layer 85, the bottom surface facing the main surface 80a, the circuit portion formed at a position closer to the bottom surface than to the top surface, and a metal layer formed between the metal shield layer 85 and the circuit portion. The metal shield layer 85 is made of copper or an alloy containing copper, or is a multilayer body containing copper, and the metal layer is made of titanium, tantalum, cobalt, tungsten, or an alloy containing at least one of titanium, tantalum, cobalt, and tungsten.

Further, in the radio frequency module 1A, the electronic component may further include a silicon layer disposed between the circuit portion and the top surface.

Since the degree of metal diffusion from the metal shield layer 85 into the silicon layer is high (diffusion coefficient is large), in a case that a barrier metal is not formed, the metal diffusion from the metal shield layer 85 into the circuit portion through the silicon layer is likely to occur. On the other hand, in the radio frequency module 1A, since the barrier metal is formed between the metal shield layer 85 and the circuit portion, even when the metal of the metal shield layer 85 diffuses into the silicon layer, the metal diffusion into the circuit portion may be suppressed.

Further, in the radio frequency module 1A, a diffusion coefficient in which a metal material constituting a metal layer diffuses into the circuit portion may be smaller than the diffusion coefficient in which the metal material constituting the metal shield layer 85 diffuses into the circuit portion.

Further, in the radio frequency module 1A, the electronic component is a power amplification module, and includes the first base member 10 whose at least part is made of the first semiconductor material, the second base member 20 whose at least part is made of the second semiconductor material different from the first semiconductor material and in which the power amplifier 21 is formed, and the metal layer described above. The second base member 20 is disposed between the main surface 80a and the first base member 10, is bonded to the first base member 10 via the metal layer, and is connected to the main surface 80a via the electrode 23. The circuit portion may include an amplification transistor included in the power amplifier 21.

With this, since the barrier metal layer 78 is disposed between the metal shield layer 85 and the power amplifier 21, the degree of metal diffusion from the barrier metal layer 78 into the power amplifier 21 may be made lower than the degree of metal diffusion from the metal shield layer 85 into the power amplifier 21. Thus, it is possible to suppress the deterioration of the amplification characteristic of the power amplifier 21 while strengthening the ground of the power amplifier 21.

Further, in the radio frequency module 1A, the first base member 10 may be connected to the main surface 80a via the electrode 24.

With this, since the electronic component formed on the first base member 10 may directly exchange a radio frequency signal and a control signal with the module substrate 80, transmission loss of a signal may be reduced.

Further, in the radio frequency module 1A, the thermal conductivity of the first semiconductor material may be higher than the thermal conductivity of the second semiconductor material.

With this, the heat dissipation property from the second base member 20 to the first base member 10 is improved.

Further, in the radio frequency module 1A, the amplification transistor is constituted of the collector layer, the base layer, and the emitter layer. The collector layer, the base layer, and the emitter layer may be laminated in the order of the collector layer, the base layer, and the emitter layer from the side of the first base member 10.

Further, in the radio frequency module 1A, the first base member 10 may include the PA control circuit 11.

With this, a wiring of the digital control signal to control the power amplifier 21 may be shortened.

Further, in the radio frequency module 1A, the electronic component is a surface acoustic wave filter, and includes the piezoelectric layer 93, the support substrate 63, the barrier metal layer 68, the high acoustic velocity layer 91, the low acoustic velocity layer 92, and the IDT electrode 94. The support substrate 63, the barrier metal layer 68, the high acoustic velocity layer 91, the low acoustic velocity layer 92, the piezoelectric layer 93, and the IDT electrode 94 may be laminated in this order.

With this, the barrier metal layer 68 is disposed between the metal shield layer 85 and the circuit portion (low acoustic velocity layer 92, piezoelectric layer 93, and IDT electrode 94). With this, the degree of metal diffusion from the barrier metal layer 68 into the circuit portion may be made lower than the degree of metal diffusion from the metal shield layer 85 into the circuit portion. Thus, it is possible to suppress deterioration of a bandpass characteristic of a surface acoustic wave filter while strengthening a ground of the surface acoustic wave filter.

Further, in the radio frequency module TA, the electronic component is a bulk acoustic wave filter, and includes the support substrate 63, the barrier metal layer 68, the acoustic multilayer film having a structure in which the low acoustic impedance film 65 and the high acoustic impedance film 64 are alternately laminated, the upper electrode 66, the lower electrode 67, and the piezoelectric layer 72. The support substrate 63, the barrier metal layer 68, the acoustic multilayer film, the upper electrode 66, the piezoelectric layer 72, and the lower electrode 67 may be laminated in this order.

With this, the barrier metal layer 68 is disposed between the metal shield layer 85 and the circuit portion (upper electrode 66, piezoelectric layer 72, and lower electrode 67). With this, the degree of metal diffusion from the barrier metal layer 68 into the circuit portion may be made lower than the degree of metal diffusion from the metal shield layer 85 into the circuit portion. Thus, it is possible to suppress deterioration of a bandpass characteristic of a bulk acoustic wave filter while strengthening a ground of the bulk acoustic wave filter.

Further, it is acceptable that the radio frequency module 1A further includes a power amplifier 21 to amplify a transmission signal, and the electronic component is a transmission filter 61T connected to the output terminal of the power amplifier 21.

A transmission filter allowing a high-power transmission signal to pass through is in a state that temperature rises and metal diffusion is accelerated. When the diffused metal is mixed into a circuit portion as an impurity, a structure of the transmission filter may vary to deteriorate a bandpass characteristic.

On the other hand, with the use of the configuration of the transmission filter 61T described above, the barrier metal layer 68 is disposed between the metal shield layer 85 and the circuit portion. With this, the degree of metal diffusion from the barrier metal layer 68 into the circuit portion may be made lower than the degree of metal diffusion from the metal shield layer 85 into the circuit portion. Thus, it is possible to suppress the deterioration of the bandpass characteristic of the transmission filter 61T while strengthening the ground of the transmission filter 61T.

Further, the communication device 5 includes the RFIC 3 to process a radio frequency signal transmitted and received by the antenna 2, and the radio frequency module 1 to transfer a radio frequency signal between the antenna 2 and the RFIC 3.

With this, it is possible to provide the communication device 5 in which characteristic deterioration of an electronic component due to metal diffusion is suppressed.

Other Embodiments and the Like

Although the radio frequency module and the communication device according to the embodiment of the present disclosure have been described with reference to the embodiment and the working examples, the radio frequency module and the communication device according to the present disclosure are not limited to the embodiment and the working examples. Other embodiments realized by combining any constituent elements in the above-described embodiment and working examples, modification examples obtained by applying various modifications conceived by those skilled in the art to the above-described embodiment and working examples without departing from the gist of the present disclosure, and various devices including the above-described radio frequency module and communication device are also included in the present disclosure.

For example, in the radio frequency module 1A according to the above-described working example, the circuit components constituting the radio frequency module 1A are distributed and arranged on the main surfaces 80a and 80b of the module substrate 80, but may be arranged only on the main surface 80a. That is, the circuit components constituting the radio frequency module 1A may be mounted on one surface of the module substrate or may be mounted on both surfaces thereof.

For example, in the radio frequency module and the communication device according to the above-described embodiment and working examples, another circuit element, a wiring, or the like may be inserted between the paths connecting the circuit elements and the signal paths disclosed in the drawings.

INDUSTRIAL APPLICABILITY

The present disclosure may widely be used in communication devices such as mobile phones as a radio frequency module disposed in a front end portion supporting a multi-band system.

REFERENCE SIGNS LIST 1, 1A RADIO FREQUENCY MODULE
2 ANTENNA
3 RF SIGNAL PROCESSING CIRCUIT (RFIC)
4 BASEBAND SIGNAL PROCESSING CIRCUIT (BBIC)
5 COMMUNICATION DEVICE
10 FIRST BASE MEMBER
10a, 10b, 80a, 80b MAIN SURFACE
11 PA CONTROL CIRCUIT
12 Si SUBSTRATE
13 INSULATION LAYER
14 Si LAYER
15 WIRING LAYER
16 VIA WIRING
17 SiN LAYER
18, 22, 23, 24 ELECTRODE
20 SECOND BASE MEMBER
20d EPITAXIAL LAYER
20n GaAs BASE MEMBER LAYER
21 POWER AMPLIFIER
21B BASE LAYER
21C COLLECTOR LAYER
21E EMITTER LAYER
23a, 24a COLUMNAR CONDUCTOR
23b, 24b, 25 BUMP ELECTRODE
31 LOW-NOISE AMPLIFIER
42, 43, 44, 45 MATCHING CIRCUIT
52, 53, 54 SWITCH
61, 62 DUPLEXER
61R, 62R RECEPTION FILTER
61T, 62T TRANSMISSION FILTER
63 SUPPORT SUBSTRATE
64 HIGH ACOUSTIC IMPEDANCE FILM
65 LOW ACOUSTIC IMPEDANCE FILM
66 UPPER ELECTRODE
67 LOWER ELECTRODE
68, 69, 78 BARRIER METAL LAYER
70, 75 SEMICONDUCTOR IC
71, 81, 82 RESIN MEMBER
72, 93 PIEZOELECTRIC LAYER
73 DIPLEXER
73H, 73L FILTER
80 MODULE SUBSTRATE
85 METAL SHIELD LAYER
91 HIGH ACOUSTIC VELOCITY LAYER
92 LOW ACOUSTIC VELOCITY LAYER
94 IDT ELECTRODE
100 ANTENNA CONNECTION TERMINAL
110 CONTROL SIGNAL TERMINAL
120 TRANSMISSION INPUT TERMINAL
130 RECEPTION OUTPUT TERMINAL
150 OUTER CONNECTION TERMINAL

The invention claimed is:

1. A radio frequency module, comprising:
a module substrate;
an electronic component on a main surface of the module substrate;
a resin covering at least part of the main surface and at least part of a side surface of the electronic component; and
a first metal layer that is on a surface of the resin and is at a ground potential,
wherein the electronic component comprises:
a first surface in contact with the first metal layer,
a second surface facing the main surface,
a circuit portion at a position closer to the second surface than to the first surface, and
a second metal layer between the first metal layer and the circuit portion, and
wherein the second metal layer is a barrier metal.

2. A radio frequency module, comprising:
a module substrate;
an electronic component on a main surface of the module substrate;
a resin covering at least part of the main surface and at least part of a side surface of the electronic component; and
a first metal layer that is on a surface of the resin and is at a ground potential,
wherein the electronic component comprises:
a first surface in contact with the first metal layer,
a second surface facing the main surface,
a circuit portion at a position closer to the second surface than to the first surface, and
a second metal layer between the first metal layer and the circuit portion,
wherein the first metal layer is made of copper or an alloy containing copper, or is a multilayer body containing copper, and
wherein the second metal layer is made of titanium, tantalum, cobalt, tungsten, or an alloy containing at least one of titanium, tantalum, cobalt, and tungsten.

3. The radio frequency module according to claim 1, wherein the electronic component further comprises a silicon layer between the circuit portion and the first surface.

4. The radio frequency module according to claim 2, wherein the electronic component further comprises a silicon layer between the circuit portion and the first surface.

5. The radio frequency module according to claim 1, wherein a diffusion coefficient in which a metal material of the second metal layer diffuses into the circuit portion is smaller than a diffusion coefficient in which a metal material of the first metal layer diffuses into the circuit portion.

6. The radio frequency module according to claim 2, wherein a diffusion coefficient in which a metal material of the second metal layer diffuses into the circuit portion is smaller than a diffusion coefficient in which a metal material of the first metal layer diffuses into the circuit portion.

7. The radio frequency module according to claim 1,
wherein the electronic component is a power amplification module, and comprises:
a first base at least partly made of a first semiconductor material,
a second base at least partly made of a second semiconductor material different from the first semiconductor material, a power amplifier being formed in the second base, and
the second metal layer,
wherein the second base is between the main surface and the first base, is bonded to the first base via the second metal layer, and is connected to the main surface via a first electrode, and
wherein the circuit portion comprises an amplification transistor of the power amplifier.

8. The radio frequency module according to claim 2,
wherein the electronic component is a power amplification module, and comprises:
a first base at least partly made of a first semiconductor material,
a second base at least partly made of a second semiconductor material different from the first semiconductor material, a power amplifier being formed in the second base, and
the second metal layer,
wherein the second base is between the main surface and the first base, is bonded to the first base via the second metal layer, and is connected to the main surface via a first electrode, and
wherein the circuit portion comprises an amplification transistor of the power amplifier.

9. The radio frequency module according to claim 7, wherein the first base is connected to the main surface via a second electrode.

10. The radio frequency module according to claim 8, wherein the first base is connected to the main surface via a second electrode.

11. The radio frequency module according to claim 7, wherein a thermal conductivity of the first semiconductor material is higher than a thermal conductivity of the second semiconductor material.

12. The radio frequency module according to claim 8, wherein a thermal conductivity of the first semiconductor material is higher than a thermal conductivity of the second semiconductor material.

13. The radio frequency module according to claim 7,
wherein the amplification transistor comprises a collector layer, a base layer, and an emitter layer, and
wherein the collector layer, the base layer, and the emitter layer are laminated, the collector layer being closest to the first base and the base layer being between the collector layer and the emitter layer.

14. The radio frequency module according to claim 8,
wherein the amplification transistor comprises a collector layer, a base layer, and an emitter layer, and
wherein the collector layer, the base layer, and the emitter layer are laminated, the collector layer being closest to the first base and the base layer being between the collector layer and the emitter layer.

15. The radio frequency module according to claim 7, wherein the first base comprises a control circuit configured to control the power amplifier.

16. The radio frequency module according to claim 8, wherein the first base comprises a control circuit configured to control the power amplifier.

17. A communication device, comprising:
a radio frequency (RF) signal processing circuit configured to process a radio frequency signal transmitted through an antenna; and
the radio frequency module according to claim 1 configured to transfer the radio frequency signal between the antenna and the RF signal processing circuit.

18. A communication device, comprising:
a radio frequency (RF) signal processing circuit configured to process a radio frequency signal transmitted through an antenna; and
the radio frequency module according to claim 2 configured to transfer the radio frequency signal between the antenna and the RF signal processing circuit.

* * * * *

UNITED STATES PATENT AND TRADEMARK OFFICE
CERTIFICATE OF CORRECTION

PATENT NO. : 12,261,351 B2
APPLICATION NO. : 18/311377
DATED : March 25, 2025
INVENTOR(S) : Takanori Uejima et al.

Page 1 of 1

It is certified that error appears in the above-identified patent and that said Letters Patent is hereby corrected as shown below:

In the Specification

Column 9, Line 62, "module LA, since the" should read --module 1A, since the--.

Column 18, Line 15, "module LA, the electronic" should be --module 1A, the electronic--.

Signed and Sealed this
Twenty-seventh Day of May, 2025

Coke Morgan Stewart
*Acting Director of the United States Patent and Trademark Office*